United States Patent
Sasaki

(10) Patent No.: US 12,151,290 B2
(45) Date of Patent: Nov. 26, 2024

(54) COATED CUTTING TOOL

(71) Applicant: MOLDINO Tool Engineering, Ltd., Tokyo (JP)

(72) Inventor: Tomoya Sasaki, Yasu (JP)

(73) Assignee: MOLDINO TOOL ENGINEERING, LTD., Tokyo (JP)

( * ) Notice: Subject to any disclaimer, the term of this patent is extended or adjusted under 35 U.S.C. 154(b) by 7 days.

(21) Appl. No.: 17/787,399

(22) PCT Filed: Oct. 12, 2020

(86) PCT No.: PCT/JP2020/038440
§ 371 (c)(1),
(2) Date: Jun. 20, 2022

(87) PCT Pub. No.: WO2021/131232
PCT Pub. Date: Jul. 1, 2021

(65) Prior Publication Data
US 2023/0024595 A1    Jan. 26, 2023

(30) Foreign Application Priority Data

Dec. 24, 2019 (JP) .................................. 2019-233353

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0641* (2013.01); *C23C 14/0664* (2013.01);
(Continued)

(58) Field of Classification Search
CPC ... B23B 27/14; B23B 27/148; B23B 2222/88; B23B 2222/92; B23B 2224/08;
(Continued)

(56) References Cited

U.S. PATENT DOCUMENTS

| 4,548,786 A | 10/1985 | Yohe |
| 2006/0127269 A1 | 6/2006 | Caron |

(Continued)

FOREIGN PATENT DOCUMENTS

| CN | 1203080 C | 5/2005 |
| CN | 1788097 A | 6/2006 |

(Continued)

OTHER PUBLICATIONS

Notice of Allowance mailed Nov. 24, 2022, issued for KR10-2022-7021050 and English translation thereof.
(Continued)

*Primary Examiner* — Kevin Ct Li
(74) *Attorney, Agent, or Firm* — Locke Lord LLP; James E. Armstrong, IV; Nicholas J. DiCeglie, Jr.

(57) ABSTRACT

Provided is a coated cutting tool in which a surface of a substrate is coated with a hard coating film. The hard coating film includes: a layer (A) disposed on the surface of the substrate, and having a face-centered cubic lattice structure, in which the total content ratio of W and Ti is at least 85 atomic %, and which contains W as the most abundant element and Ti as the next most abundant element among metal (including metalloid) elements; and a layer (B) disposed on the layer (A) and having a face-centered cubic lattice structure, which is composed of nitrides or carbonitrides containing Al, Cr, and Si, and in which, among metal (including metalloid) elements, the Al content ratio is at least 50 atomic %, the total content ratio of Al and Cr is at least 85 atomic %, and the Si content ratio is 4 to 15 atomic %.

12 Claims, 4 Drawing Sheets

(51) Int. Cl.
*C23C 14/16* (2006.01)
*C23C 28/00* (2006.01)

(52) U.S. Cl.
CPC .............. *C23C 14/16* (2013.01); *C23C 28/34* (2013.01); *C23C 28/40* (2013.01); *B23B 2222/88* (2013.01); *B23B 2222/92* (2013.01); *B23B 2224/08* (2013.01); *B23B 2226/00* (2013.01)

(58) Field of Classification Search
CPC ... B23B 2226/00; B23B 2228/10; B23C 5/16; B23C 2228/10; C23C 14/022; C23C 14/024; C23C 14/025; C23C 14/0641; C23C 14/0664; C23C 14/26; C23C 14/325; C23C 28/34; C23C 28/40; C23C 30/005

See application file for complete search history.

(56) References Cited

U.S. PATENT DOCUMENTS

2017/0096733 A1    4/2017  Sasaki et al.
2018/0355471 A1*  12/2018  Fuwa ................. C04B 35/62615
2020/0376567 A1*  12/2020  Isaka .................. C23C 14/0664

FOREIGN PATENT DOCUMENTS

| CN | 1274674 C | 9/2006 |
| CN | 100374599 C | 3/2008 |
| CN | 104789938 A | 7/2015 |
| JP | 2009-220260 A | 10/2009 |
| JP | 2015174196 A * | 10/2015 |
| JP | 2017-001147 A | 1/2017 |
| KR | 10-2016-0131046 A | 11/2016 |
| WO | 2014/156699 A1 | 10/2014 |
| WO | 2014/157688 A1 | 10/2014 |
| WO | 2017/094440 A1 | 6/2017 |

OTHER PUBLICATIONS

Office Action mailed Dec. 7, 2022, issued for IN202217035886.
Office Action mailed Oct. 10, 2022, issued for Chinese Patent Application No. 202080088810.0 and English translation thereof.
Supplementary European Search Report mailed Nov. 10, 2022, issued for European Patent Application No. 20907965.6.
International Search Report mailed Dec. 22, 2020, issued for PCT/JP2020/038440 and English translation thereof.

* cited by examiner

< LAYER A >

COATED CUTTING TOOL

TECHNICAL FIELD

The present invention relates to a coated cutting tool such as an end mill.

Priority is claimed on Japanese Patent Application No. 2019-233353, filed Dec. 24, 2019, the content of which is incorporated herein by reference.

BACKGROUND ART

AlCrSi nitrides or carbonitrides form film species with excellent heat resistance and wear resistance and are applied to coated cutting tools. The present inventor has proposed a coated cutting tool as a tool applicable to milling of high-hardness steel, in which an interlayer coating film containing W and Ti that form an hcp structure is formed immediately above a substrate by Ti bombardment, and AlCrSi nitrides or carbonitrides whose coating film structure is refined by increasing the Si content are provided immediately thereabove (Patent Document 1).

CITATION LIST

Patent Document

[Patent Document 1]
International Patent Publication No. WO2014/156699

SUMMARY OF INVENTION

Technical Problem

The coated cutting tool described in Patent Document 1 has excellent durability in cutting of high-hardness steel. On the other hand, the present inventor has confirmed that a composition of the interlayer coating film formed through Ti bombardment is likely to vary. If the composition of the interlayer coating film varies widely, the durability of a hard coating film is likely to change depending on machining conditions and tool shapes, and tool performance may not be stable.

Solution to Problem

The present inventor has found the following and has reached the present invention.

The present inventor has set a composition of an interlayer coating film formed through Ti bombardment to a composition that is mainly composed of W and Ti, with a small amount containing components of a hard coating film provided immediately above the interlayer coating film. The present inventor has confirmed that, by using the interlayer coating film having the above composition, variation in the composition of the interlayer coating film is reduced and a crystal structure thereof becomes a face-centered cubic lattice structure. In addition, the present inventor has confirmed that, by forming a hard coating film made of AlCrSi-based nitrides or carbonitrides with an adjusted Si content on the interlayer coating film of a face-centered cubic structure, a coated cutting tool with excellent durability can be obtained.

That is, the present invention is a coated cutting tool in which a surface of a substrate is coated with a hard coating film. The hard coating film includes: a layer (A) that is disposed on the surface of the substrate and has a face-centered cubic lattice structure, in which a total content ratio of W and Ti is at least 85 atomic %, and which contains W as the most abundant element and Ti as the next most abundant element among metal (including metalloid) elements; and a layer (B) that is disposed on the layer (A) and has a face-centered cubic lattice structure, which is composed of nitrides or carbonitrides containing Al, Cr, and Si, and in which, among metal (including metalloid) elements, the Al content ratio (atomic %) is at least 50%, a total content ratio (atomic %) of Al and Cr is at least 85%, and the Si content ratio (atomic %) is at least 4% and at most 15%.

The layer (A) preferably has a total content ratio of W and Ti of at least 85 atomic % among metal (including metalloid) elements.

The layer (A) preferably has a total content ratio of Al and Si of at most 10 atomic % among metal (including metalloid) elements.

On the layer (B), a layer (C) made of metal (including metalloid) nitrides or carbonitrides may be further provided.

The layer (C) is preferably of nitrides or carbonitrides in which, among metal (including metalloid) elements, the Ti content ratio (atomic %) is at least 50%, and the Si content ratio (atomic %) is at least 1% and at most 30%.

Advantageous Effects of Invention

According to the present invention, a coated cutting tool having excellent durability is provided.

DESCRIPTION OF EMBODIMENTS

Figure 1:
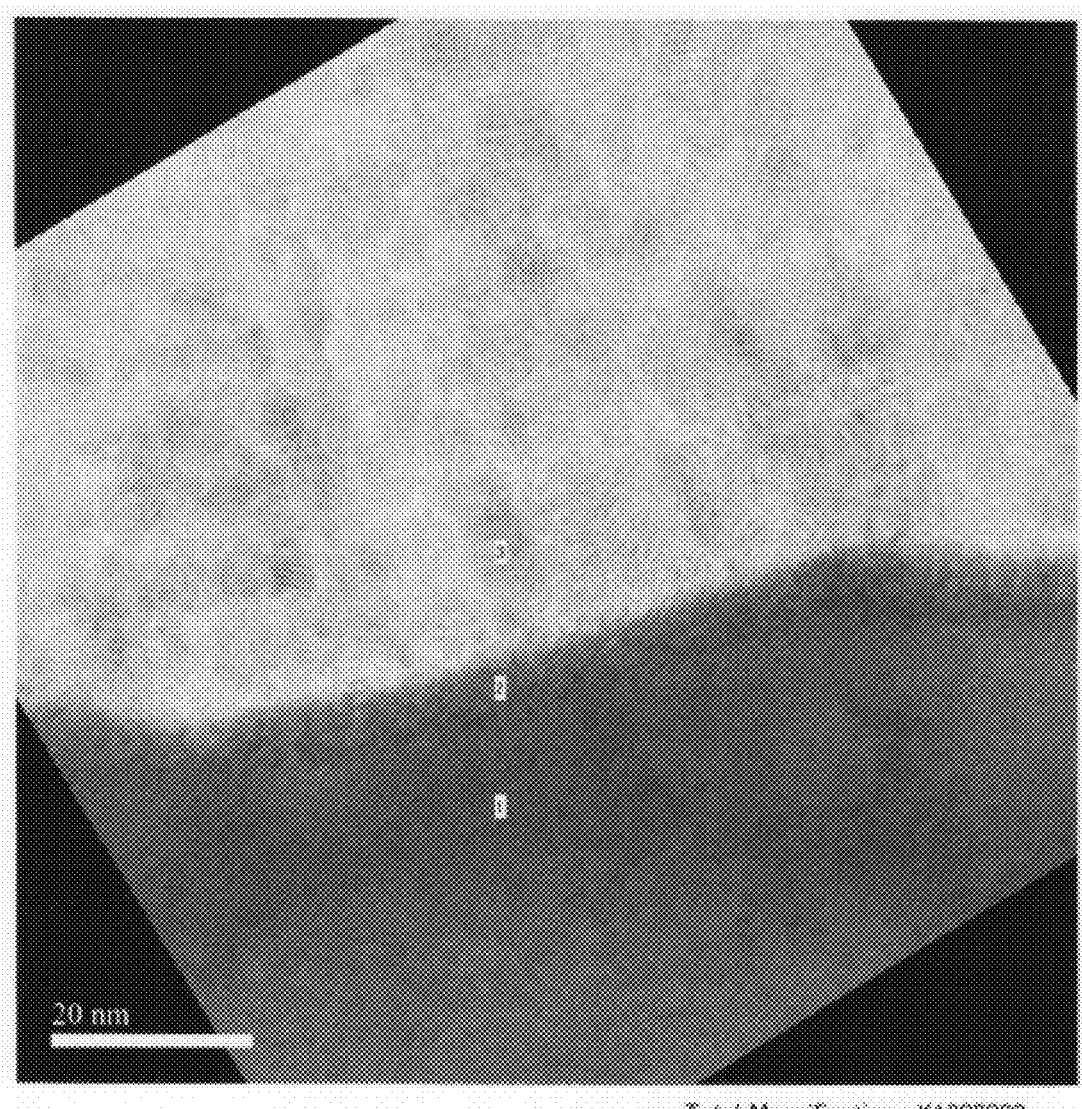
FIG. 1 is a transmission electron micrograph of a tool cutting edge portion of an Example 1. In the figure, the site indicated by reference numeral 1 is a substrate, the site indicated by reference numeral 2 is layer (A), and the site indicated by reference numeral 3 is layer (B).
Figure 2:
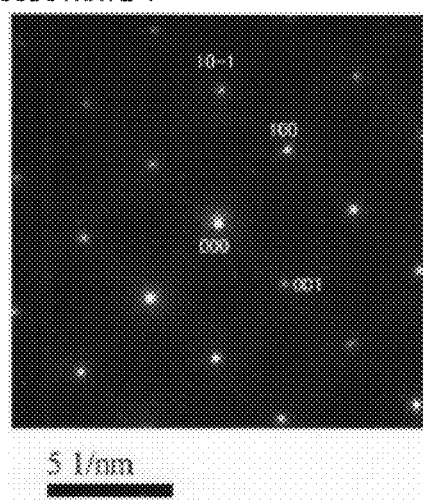
FIG. 2 is a diagram showing a selected area diffraction pattern of the substrate of the Example 1.
Figure 3:
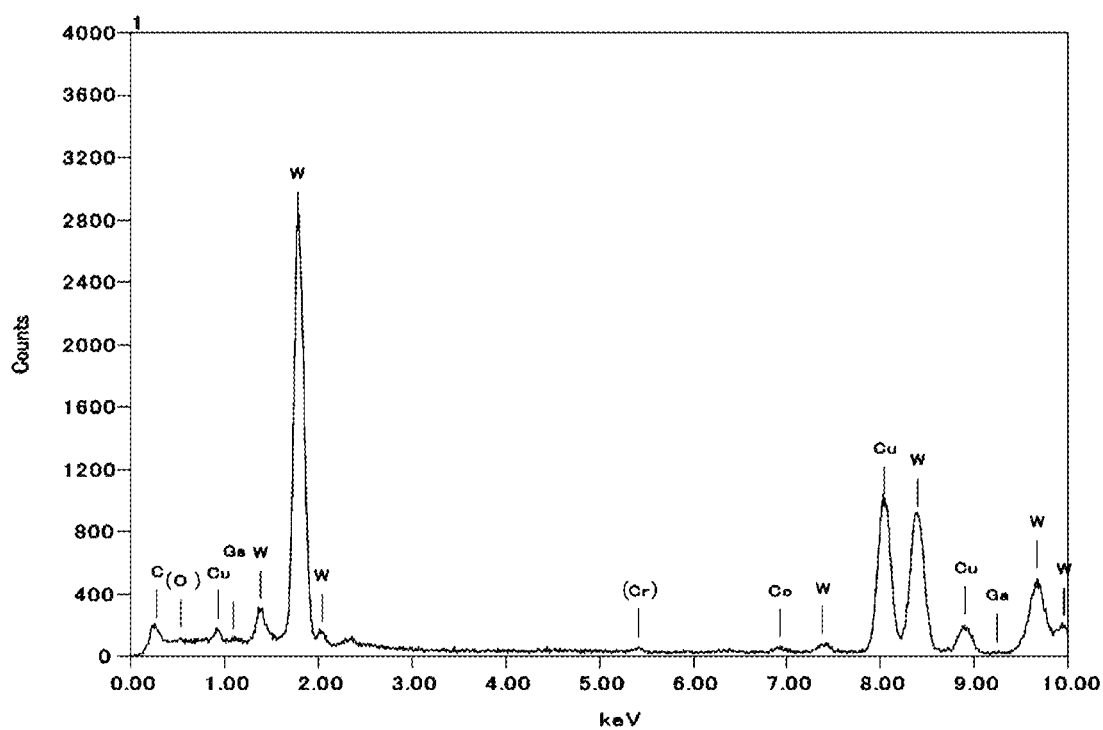
FIG. 3 is a diagram showing a composition analysis result of the substrate of the Example 1.
Figure 4:
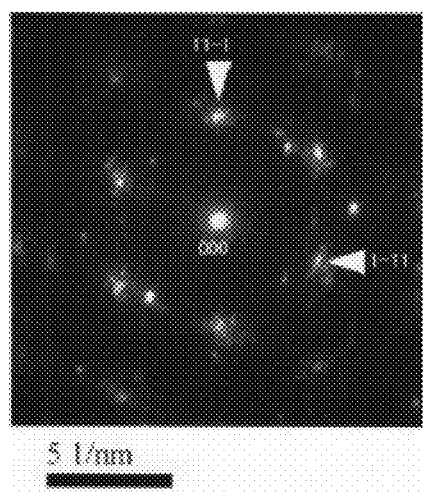
FIG. 4 is a diagram showing a selected area diffraction pattern of the layer (A) of the Example 1.
Figure 5:
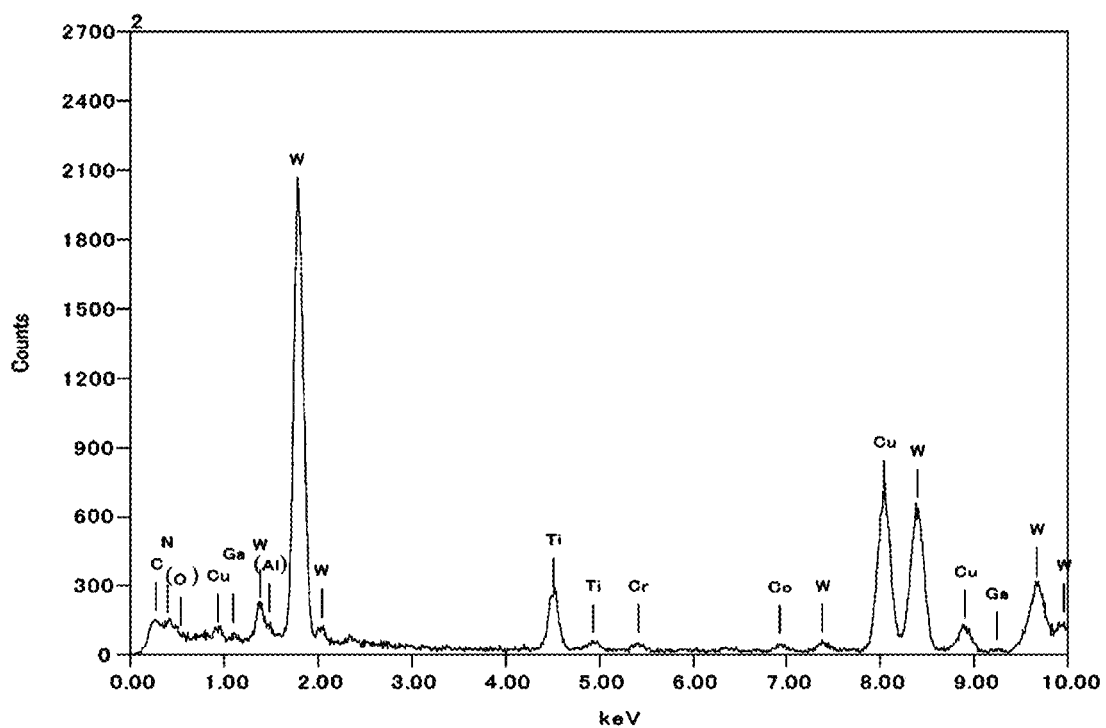
FIG. 5 is a diagram showing a composition analysis result of the layer (A) of the Example 1.
Figure 6:
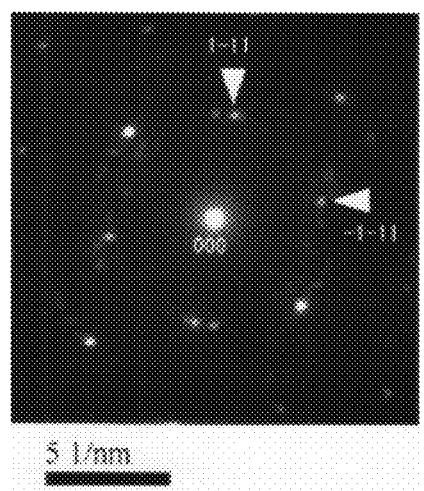
FIG. 6 is a diagram showing a selected area diffraction pattern of the layer (B) of the Example 1.
Figure 7:
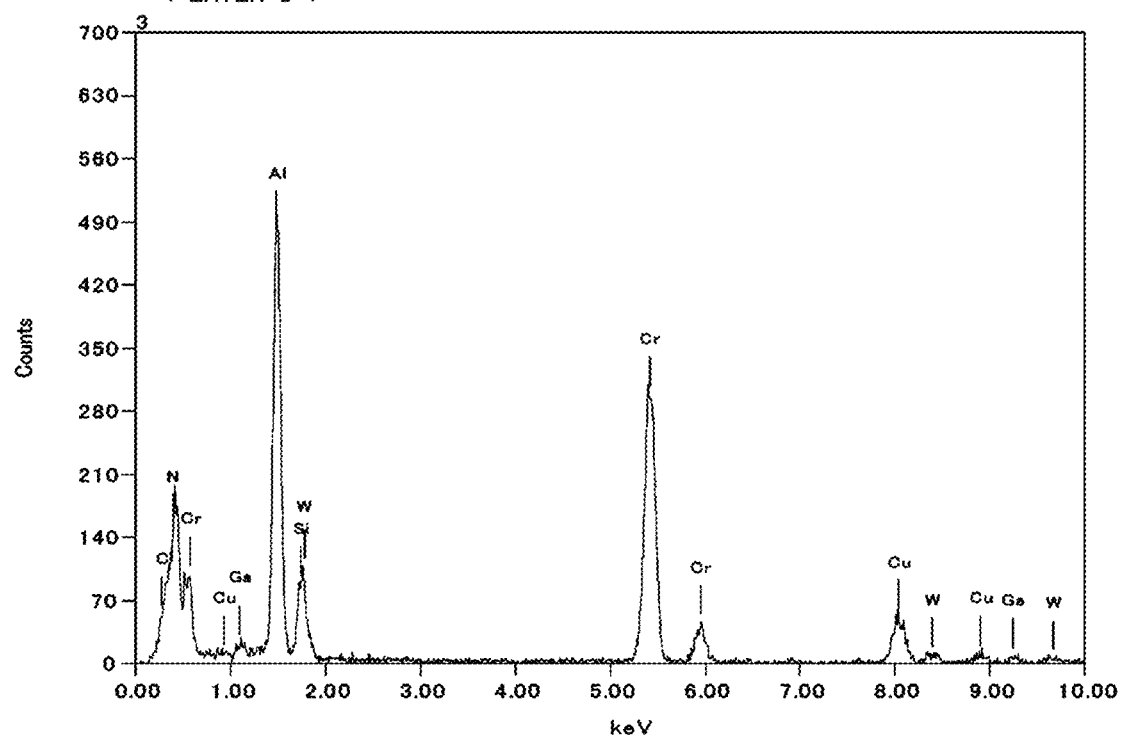
FIG. 7 is a diagram showing a composition analysis result of the layer (B) of the Example 1.

The present inventor has studied factors that cause damage to a coated cutting tool in highly efficient machining of high-hardness steel and has confirmed that coating film fracture easily occurs starting from columnar grain boundaries that form a hard coating film. In addition, the present inventor has found that it is effective to reduce the number of grain boundaries serving as starting points of fracture by refining a structure of a coating film on the basis of nitrides or carbonitrides mainly composed of Al and Cr, which form film species with excellent heat resistance and wear resistance. Further, the present inventor has found that it is required to provide an interlayer coating film having a face-centered cubic lattice structure (fcc structure) in order to further enhance adhesion between a substrate and the hard coating film due to refinement of the structure of the hard coating film and has reached the present invention. Details of the present invention will be described below.

A coated cutting tool of the present embodiment includes a substrate, a layer (A) disposed on a surface of the substrate, and a layer (B) disposed on the layer (A). In the coated cutting tool of the present embodiment, the layer (B) is a hard coating film that imparts durability to a tool. The layer (A) is an interlayer coating film that improves adhesion between the layer (B) and the substrate.

For the substrate, a WC-based cemented carbide substrate for a cutting tool is used. The substrate may be a solid tool in which a head and a shank are integrated, a head of a head-interchangeable tool, or a cutting insert mounted on a holder.

First, the layer (B), which is the hard coating film of the present invention, will be described.

The layer (B) is a hard coating film made of nitrides or carbonitrides mainly composed of Al and Cr provided on the layer (A), which will be described later. Nitrides or carbonitrides mainly composed of Al and Cr form film species that can exhibit excellent wear resistance and heat resistance for a coated cutting tool. A more preferable material for the layer (B) is nitrides having excellent heat resistance.

Al is an element that imparts heat resistance to the hard coating film. In order to impart better heat resistance to the hard coating film, the Al content ratio (atomic %, the same applies hereinafter) of the layer (B) is set to at least 50% among content ratios of metal (including metalloid, the same applies hereinafter) elements. Further, the Al content ratio of the layer (B) is preferably set to at least 55%. On the other hand, in the layer (B), when the Al content ratio increases too much, a hexagonal close-packed structure (hcp structure) becomes a main structure, and durability of the coated cutting tool tends to deteriorate. For that reason, the Al content ratio of the layer (B) is preferably set to at most 70%. In order to achieve both heat resistance and wear resistance at a high level in the layer (B), a total content ratio of Al and Cr is set to at least 85%. Furthermore, the total content ratio of Al and Cr in the layer (B) is preferably set to at least 90%.

Cr is an element that causes a crystal structure of the layer (B) to be a face-centered cubic lattice structure (fcc structure) and improves wear resistance and heat resistance for a coated cutting tool. In the layer (B), when the Cr content ratio becomes too small, a hexagonal close-packed structure (hcp structure) becomes a main structure, and durability of the coated cutting tool tends to deteriorate. For that reason, the Cr content ratio of the layer (B) is preferably at least 20%. Also, the metalloids in the present invention are Si and B (boron).

Si is an important element for refining a structure of nitrides or carbonitrides mainly composed of Al and Cr. In AlCrN that does not contain Si and AlCrSiN that has a small Si content ratio, columnar particles become coarse. Since the hard coating film having such a structure form has many grain boundaries serving as starting points of coating film fracture, wear of a flank tends to increase. On the other hand, a structure of AlCrSiN containing a certain amount of Si becomes finer, and clear columnar particles are less likely to be observed in cross-section observation (20,000 times) with an electron microscope, for example. The hard coating film having such a structure form has fewer columnar grain boundaries serving as the starting points of fracture, and wear of the flank can be inhibited. However, in the layer (B), when the Si content ratio increases, an amorphous and hexagonal close-packed structure (hcp structure) is likely to be a main structure, and durability of the coated cutting tool deteriorates. In order to sufficiently refine a coating film structure without deteriorating durability of the coated cutting tool, it is important that the Si content ratio of the layer (B) be set to at least 4% and at most 15%. The Si content ratio of the layer (B) is preferably at least 5%. The Si content ratio of the layer (B) is preferably at most 10%.

In the coated cutting tool of the present embodiment, it is important that the layer (B) have a face-centered cubic lattice structure (fcc structure). The face-centered cubic lattice structure (fcc structure) in the present embodiment means that, for example, in X-ray diffraction, a diffraction intensity due to a face-centered cubic lattice structure (fcc structure) shows the maximum intensity. Since a hard coating film in which a diffraction intensity due to a hexagonal close-packed structure (hcp structure) is the maximum intensity is fragile, it has poor durability for a coated cutting tool. In particular, in wet processing, the durability tends to deteriorate.

It is preferable that a diffraction intensity of the layer (B) due to a ZnS type crystal structure be not observed in X-ray diffraction. However, if a diffraction intensity due to a NaCl-type crystal structure shows the maximum intensity, the layer (B) may partially contain a hexagonal close-packed structure (hcp structure) and an amorphous phase.

However, in a case in which a test area of the coating film is small, or another coating film, which will be described later, is coated on the layer (B), it may be difficult to identify the face-centered cubic lattice structure (fcc structure) by the above-mentioned X-ray diffraction. In such a case, identification of the crystal structure can be performed by a selected area diffraction method using, for example, a transmission electron microscope (TEM).

A microstructure of the layer (B) in the present embodiment has a structure form in which a crystal phase having a relatively low Si content with respect to the total Si content is dispersed in a crystal phase having a relatively high Si content with respect to the total Si content. By forming the layer (B) to have such a structure, a higher residual compressive stress is applied to the hard coating film, and growth of cracks is inhibited even at a micro level. Thus, it is thought that excellent durability can be exhibited. In general, when the Si content ratio increases, the nitrides or carbonitrides mainly composed of Al and Cr are likely to have a structure form mainly composed of an amorphous phase, and its toughness tends to deteriorate.

The layer (B) of the present embodiment is a layer having a crystal structure having a crystal phase. In order to improve crystallinity of the layer (B), coating is performed by increasing a magnetic flux density in the vicinity of the substrate in a film forming device. Specifically, in the film forming device, an average magnetic flux density in the vicinity of a center of a target is at least 14 mT. In addition, permanent magnets are disposed on a back surface and an outer periphery of the target, and the layer (B) is coated using a cathode adjusted such that lines of magnetic force reach the vicinity of the substrate. Further, when an absolute value of a negative bias voltage applied to the substrate decreases, the amorphous phase tends to increase. Coating of the layer (B) is preferably performed with a bias voltage of at least −250 V and at most −100 V. In order to further stabilize the crystal phase, the coating is more preferably performed with a bias voltage of at least −220 V and at most −150 V.

If the diffraction intensity due to the face-centered cubic lattice structure (fcc structure) is within a range in which it shows the maximum intensity, the layer (B) can contain other metal elements in consideration of contents of Al, Cr and Si. For example, for the purpose of improving wear resistance, heat resistance, lubricity, or the like of the hard coating film, it can contain elements of Group 4a, Group 5a, or Group 6a of the Periodic Table and one or more elements selected from B, Y. and Cu. These elements are elements that are generally added to AlTiN-based and AlCrN-based hard coating films in order to improve characteristics of the hard coating films, and unless their content ratios are excessive, durability of the coated cutting tool will not significantly deteriorate.

However, if the layer (B) contains a large amount of metal elements other than Al, Cr and Si, the above-described basic characteristics may be impaired and durability of the coated cutting tool may deteriorate. For that reason, even in a case in which the layer (B) contains additive elements other than Al, Cr, and Si, a total content ratio of the additive elements is preferably set to at least 10%. Further, even in a case in which the layer (B) contains metal elements other than Al, Cr and Si, a total content ratio of additive elements is preferably set to at most 5%.

If a film thickness of the layer (B) becomes too thin, excellent durability may not be fully exhibited. In addition, if the film thickness becomes too thick, peeling of the coating film may occur. For the thickness of the layer (B), for example, an appropriate value may be selected from a range of at least 0.5 μm and at most 10 μm. The thickness of the layer (B) is more preferably at least 1 μm. Also, the thickness of the layer (B) is more preferably at most 5 m.

In the present embodiment, effects of the present embodiment are exhibited even if other layers are coated on the layer (B). For that reason, a coating film structure including the layer (A) and the layer (B) in the present embodiment may adopt a structure in which other layers are coated, in addition to a structure in which the layer (B) is the outermost surface of the tool. In this case, a layer (C) made of nitrides or carbonitrides having excellent heat resistance and wear resistance is preferably coated as a protective film on the layer (B). The layer (C) is more preferably a layer made of a nitride. The layer (C) is preferably a hard coating film having a residual compressive stress that is excellent for thermal shock resistance. A composition of the layer (C) may be appropriately selected depending on workpieces and processing conditions. Particularly in wet processing, since the hard coating film is easily peeled off through heating and cooling cycles, it is preferable to provide a hard coating film having a high residual compressive stress as the protective film.

For the layer (C), particularly in consideration that it forms film species with high residual compressive stress, a nitride or carbonitride film including a Ti content ratio of at least 50% and a Si content ratio of at least 1% and at most 30% is preferable.

Next, the layer (A) will be described.

Since the layer (B), which is the hard coating film in the present embodiment, has a fine structure form, its adhesion to the substrate is poor. The present inventor has confirmed that the layer (A) having the face-centered cubic lattice structure (fcc structure), in which a total content ratio of W and Ti is at least 85%, and which contains W as the most abundant element and Ti as the next most abundant element among metal elements, are provided on the substrate, and thus its adhesion to the layer (B) that has a fine structure form is improved, and durability of the coated cutting tool is improved. That is, by forming the layer (A) having the face-centered cubic lattice structure (fcc structure) mainly composed of W and Ti between the substrate and the layer (B), the coated cutting tool of the present embodiment has improved the adhesion of the layer (B), which has a fine structure form, to the substrate.

By forming the layer (A) formed between the substrate and the layer (B) to have the face-centered cubic lattice structure (fcc structure), the layer (B) having a fine structure formed on an upper surface of the layer (A) is likely to maintain the face-centered cubic lattice structure (fcc structure). In addition, it is thought that crystallinity of the layer (B) in the vicinity of the layer (A) is further enhanced, and the adhesion between the substrate and the layer (B) is further enhanced. Further, by setting the total content ratio of W and Ti among the metal (including metalloid) elements is set to at least 85%, a composition and a crystal structure of the layer (A) are stabilized. Thus, non-uniformity of a composition and the crystal structure of the layer (B) due to variations in the composition and crystal structure of the layer (A) is reduced. Since uniform durability can be easily obtained in the entire layer (B), a risk of variation in tool performance depending on cutting conditions or tool shapes can be reduced. In the layer (A), the total content ratio of W and Ti among the metal (including metalloid) elements is preferably at least 90%.

The layer (A) may contain a hard coating film component and a substrate component in addition to W and Ti. However, in order to stabilize the composition and the crystal structure of the layer (A), in the layer (A), a total content ratio of Al and Si among the metal (including metalloid) elements is preferably at most 10%. By reducing amounts of Al and Si contained in the layer (A), the composition and the crystal structure of the layer (A) become more stable.

The layer (A) is likely to contain Co and Cr contained in a bonded phase of the substrate. Even in a case in which the layer (A) contains Co and Cr, a total content ratio of Co and Cr among the metal (including metalloid) elements is preferably at most 10%. The layer (A) can be confirmed through cross-section observation by transmission electron microscope observation, composition analysis, and nanobeam diffraction patterns.

The layer (A) contains, as non-metal elements, carbon as the most abundant element and nitrogen as the next most abundant element. In addition, the layer (A) may contain oxygen in addition to carbon and nitrogen. In a case in which the total content ratio of carbon, nitrogen and oxygen in the layer (A) is set to 100%, the layer (A) contains at least 50% of carbon. Also, the layer (A) preferably contains at least 60% of carbon. Further, the layer (A) A preferably contains at least 30% of nitrogen. The layer (A) preferably contains at most 10% of oxygen.

If a thickness of the layer (A) becomes too thin, its adhesion to the substrate deteriorates. In addition, even if the thickness of the layer (A) becomes too large, the adhesion to the substrate tends to deteriorate. Accordingly, the thickness of the layer (A) is preferably at least 1 nm and at most 30 nm. The thickness of the layer (A) is preferably at least 2 nm and at most 10 nm.

In order to form the layer (A) of the present embodiment on the substrate, Ti bombardment is performed on the substrate. A film forming device used for Ti bombardment preferably includes a cathode having a magnetic field configuration in which a coil magnet is disposed on the outer periphery of the target to confine an arc spot inside the target. By performing bombardment treatment with Ti, which is an elemental species that easily forms carbides, using such a cathode, oxides on the surface of the substrate are removed and cleaned. Further, in addition to this cleaning, bombarded Ti ions diffuse into WC on the surface of the substrate, and a layer containing W and Ti is easily formed.

In the present embodiment, by forming the layer (A) containing W and Ti on a cutting edge, which is a functional portion, adhesion between the substrate and the hard coating film on the cutting edge is enhanced, and the effect of enhancing durability of the coated cutting tool can be obtained.

In order to cause the layer (A) to have the face-centered cubic lattice structure (fcc structure), a temperature of the substrate at the start of Ti bombardment is preferably high. For that reason, it is preferable to set a temperature inside a furnace at the start of Ti bombardment to at least 530° C.

Further, in a case in which an absolute value of a negative bias voltage applied to the substrate during Ti bombardment is small or an electric current applied to the target is low, it is difficult to form the layer containing W and Ti on the surface of the substrate. For that reason, the negative bias voltage applied to the substrate is preferably at least $-1000$ V and at most $-700$ V. Also, the electric current applied to the target is preferably at least 80 A and at most 150 A.

Although Ti bombardment may be performed while argon gas, nitrogen gas, hydrogen gas, hydrocarbon gas, or the like is introduced, Ti bombardment is preferably performed in an atmosphere inside the furnace set under a vacuum of about 0.1 Pa, so that not only the surface of the substrate is cleaned, but also arc discharge is stabilized and the layer (A) is easily formed.

Also, according to studies of the present inventor, it has been confirmed that the thickness of the layer (A) formed on the cutting edge of the tool is affected by differences in tool diameters or shapes such as cutting edge shapes.

Examples

Variations in each interlayer coating film of coated cutting tools of Examples 1 and 2 and coated cutting tools of Comparative Examples 1 and 2 when coated under the same conditions were evaluated. Then, tool performances of the coated cutting tools of the Examples 1 and 2 and the Comparative Examples 1 and 2 were evaluated.

<Film Forming Device>

An arc ion plating type film forming device was used for film formation. The device includes a plurality of cathodes (arc evaporation sources), a vacuum container, and a substrate rotation mechanism.

As for the cathodes, one cathode in which a coil magnet disposed on an outer periphery of a target (hereinafter referred to as "C1"), and two cathodes in which permanent magnets are disposed on a back surface and the outer periphery of the target and which have a magnetic field with a magnetic flux density of at least 14 mT in the vicinity of a center of the target in a direction perpendicular to the target (hereinafter referred to as "C2" and "C3") are mounted.

Inside air in the vacuum container is exhausted by a vacuum pump, and a gas is introduced thereto from a supply port.

A bias power supply is connected to each substrate installed in the vacuum container, and a negative DC bias voltage is independently applied to each substrate.

A planetary, a plate-shaped jig on the planetary, and a pipe-shaped jig on the plate-shaped jig are attached to the substrate rotation mechanism, the planetary rotates at a speed of 3 revolutions per minute, and the plate-shaped jig and the pipe-shaped jig revolve themselves. A metallic titanium target was installed in C1, an AlCrSi alloy target was installed in C2, and a TiSi alloy target was installed in C3.

<Substrate>

As the substrate, a two-edge ball end mill made of a cemented carbide (manufactured by MOLDINO Tool Engineering Co., Ltd.) whose composition is WC (bal.)-Co (8% by mass)-Cr (0.5% by mass)-VC (0.3% by mass), WC having an average particle size of 0.6 μm and a hardness of 93.9 HRA, was prepared. Also, WC represents a tungsten carbide, Co represents cobalt, Cr represents chromium, and VC represents a vanadium carbide.

<Heating and Vacuum Exhaust Process>

In manufacturing processes of the Examples 1 and 2, each substrate was fixed to the pipe-shaped jig in the vacuum container, and a pre-deposition process was performed as follows. First, vacuum exhaust was performed for the inside of the vacuum container to be at most $8 \times 10^{-3}$ Pa. Then, vacuum exhaust was performed while heating the substrate to a temperature of 550° C. using a heater installed in the vacuum container. Thus, the temperature of the substrate was set to 550° C., and a pressure in the vacuum container was set to at most $8 \times 10^{-3}$ Pa.

<Ar Bombardment Process>

After that, Ar gas was introduced into the vacuum container, and the pressure inside the container was set to 0.67 Pa. After that, an electric current of 20 A was applied to a filament electrode, a negative pressure bias voltage of $-200$ V was applied to the substrate, and Ar bombardment was performed for 4 minutes.

<Ti Bombardment Process>

After that, vacuum exhaust was performed so that the pressure in the vacuum container became at most $8 \times 10^{-3}$ Pa. Subsequently, Ar gas was introduced to set the pressure in the vacuum container to 0.1 Pa, a bias voltage was applied to the substrate, and an arc electric current of 150 A was supplied to C1 to perform Ti bombardment treatment.

<Film Forming Process>

Immediately after the Ti bombardment, the power supply to C1 was interrupted. Then, the gas in the vacuum container was replaced with nitrogen, the pressure in the vacuum container was set to 5 Pa, and a set temperature of the substrate was set to 520° C. An electric power of 150 A was supplied to C2, the negative bias voltage applied to the substrate was set to $-200$ V, a cathode voltage was set to 25 V, and $Al_{56}Cr_{37}Si_6$ nitrides (numerical values are atomic ratios, the same applies hereinafter) of about 2 μm having an fcc structure were coated. Subsequently, a power of 150 A was supplied to C3, the negative bias voltage applied to the substrate was set to $-100$ V, the cathode voltage was set to 25 V, and $Ti_{75}Si_{25}$ nitrides of about 1 μm having an fcc structure were coated. After that, the substrate was cooled to about at most 250° C. and taken out from the vacuum container. The Examples 1 and 2 were separately coated under the same conditions.

In manufacturing processes of the Comparative Examples 1 and 2, Ti bombardment was performed at the pressure in the vacuum container of $8 \times 10^{-3}$ Pa, without introducing Ar into the furnace before the Ti bombardment, unlike the manufacturing processes of the Examples 1 and 2 described above. Further, the temperature of the Ti bombardment process, which was 550° C., was changed to 520° C. Coating films of the Comparative Examples 1 and 2 were separately coated under the same conditions.

In order to confirm a structure of the coating film, a cross-section observation of a cutting edge of the ball end mill was performed using a field emission transmission electron microscope (JEM-2010F type manufactured by JEOL Ltd.). Each sample was cut and attached to a dummy substrate using an epoxy resin. After that, cutting, bonding of a Mo reinforcing ring, polishing, dimpling, and Ar ion milling were performed to prepare a sample for measurement. Carbon vapor deposition was applied before the measurement. Observation, composition analysis, and nanobeam diffraction were performed at an acceleration voltage of 200 kV The composition was analyzed using a UTW type Si (Li) semiconductor detector attached to the microscope with a beam diameter of 1 nm.

In the composition analysis, a minute peak was regarded as a detection peak of an element only when its intensity is 3 times or more a standard deviation of a background intensity in order to distinguish it from peaks due to background fluctuations. Nanobeam diffraction was performed with a camera length of 50 cm and a beam diameter of at most 2 nm.

FIG. 1 is a transmission electron micrograph of a tool cutting edge portion of the Example 1. In the figure, the point indicated by reference numeral 1 is the substrate, the point indicated by reference numeral 2 is the layer (A), and the point indicated by reference numeral 3 is the layer (B). FIGS. 2 to 7 show analysis results of the coated cutting tool of the Example 1.

Table 1 shows analysis results of interlayer coating films (layers (A)).

TABLE 1

| | Composition of metal component of interlayer coating film (atomic %) | Crystal structure |
|---|---|---|
| Example 1 | W67Ti26Cr3Co4 | (W, Ti)C1-x, fcc |
| Example 2 | W82Ti14Cr4 | (W, Ti)C1-x, fcc |
| Comparative Example 1 | W48Ti16Al7Si23Cr5Co1 | WC, hcp |
| Comparative Example 2 | W48Ti8Al35Cr7Co2 | WC, hcp |

The layers (A) of the Examples 1 and 2 had a face-centered cubic lattice structure (fcc structure) with small content ratios of elements other than W and Ti. On the other hand, the layers (A) of the Comparative examples 1 and 2 contained a large amount of Al or Si, which is a component of the hard coating film, and had a hexagonal close-packed structure (hcp structure). It was confirmed that, in the layers (A) of the Comparative Examples 1 and 2, a difference in composition was large inside the film.

Cutting evaluation was performed for the coated cutting tools of the Examples 1 and 2 under the following machining conditions.
<Cutting Conditions>
  Tool: 2-edge carbide ball end mill
  Model number: EPDBE2010-6, tool radius of 0.5 mm
  Dry machining
  Cutting method: Bottom cutting
  Workpiece: STAVAX (52HRC) (manufactured by Uddeholms AB)
  Notch: Axial direction, 0.04 mm, radial direction, 0.04 mm
  Cutting speed: 75.4 m/min
  Single edge feed amount: 0.0179 mm/edge
  Cutting distance: 15 m It was confirmed that the coated cutting tools of the Examples 1 and 2 had the maximum wear width of a flank as small as less than 20 μm, showed a uniform and stable wear form, and were excellent in durability. On the other hand, in the coated cutting tools of the Comparative Examples 1 and 2, wear states of the hard coating films were slightly uneven as compared with the coated cutting tools of the Examples 1 and 2. According to the coated cutting tool of the present invention, by reducing the variation in the composition of the interlayer coating film, film quality of the hard coating film can be improved, and it is expected to exhibit stable tool performance even under various machining conditions.

The invention claimed is:
1. A coated cutting tool in which a surface of a substrate is coated with a hard coating film, the hard coating film comprising:
    a layer (A) that is disposed on the surface of the substrate and has a face-centered cubic lattice structure, in which a total content ratio of W and Ti is at least 85 atomic %, and which contains W as the most abundant element and Ti as the next most abundant element among metal elements including metalloid elements; and a layer (B) that is disposed on the layer (A) and has a face-centered cubic lattice structure, which is composed of nitrides or carbonitrides containing Al, Cr, and Si, and in which, among metal elements including metalloid elements, the Al content ratio is at least 50 atomic %, a total content ratio of Al and Cr is at least 85 atomic %, and the Si content ratio is at least 4 atomic % and at most 15 atomic %.

2. The coated cutting tool according to claim 1, wherein the layer (A) has a total content ratio of W and Ti of at least 90 atomic % among the metal elements including metalloid elements.

3. The coated cutting tool according to claim 1, wherein the layer (A) has a total content ratio of Al and Si of at most 10 atomic % among the metal elements including metalloid elements.

4. The coated cutting tool according to claim 1, wherein a layer (C) made of metal nitrides or carbonitrides including metalloid nitrides or carbonitrides is further provided on the layer (B).

5. The coated cutting tool according to claim 4, wherein the layer (C) is made of nitrides or carbonitrides in which, among the metal elements including metalloid elements, the Ti content ratio is at least 50 atomic %, and the Si content ratio is at least 1 atomic % and at most 30 atomic %.

6. The coated cutting tool according to claim 2, wherein the layer (A) has a total content ratio of Al and Si of at most 10 atomic % among the metal elements including metalloid elements.

7. The coated cutting tool according to claim 2, wherein a layer (C) made of metal nitrides or carbonitrides including metalloid nitrides or carbonitrides is further provided on the layer (B).

8. The coated cutting tool according to claim 3, wherein a layer (C) made of metal nitrides or carbonitrides including metalloid nitrides or carbonitrides is further provided on the layer (B).

9. The coated cutting tool according to claim 6, wherein a layer (C) made of metal nitrides or carbonitrides including metalloid nitrides or carbonitrides is further provided on the layer (B).

10. The coated cutting tool according to claim 7, wherein the layer (C) is made of nitrides or carbonitrides in which, among the metal elements including metalloid elements, the Ti content ratio is at least 50 atomic %, and the Si content ratio is at least 1 atomic % and at most 30 atomic %.

11. The coated cutting tool according to claim 8, wherein the layer (C) is made of nitrides or carbonitrides in which, among the metal elements including metalloid elements, the Ti content ratio is at least 50 atomic %, and the Si content ratio is at least 1 atomic % and at most 30 atomic %.

12. The coated cutting tool according to claim 9, wherein the layer (C) is made of nitrides or carbonitrides in which, among the metal elements including metalloid elements, the Ti content ratio is at least 50 atomic %, and the Si content ratio is at least 1 atomic % and at most 30 atomic %.

* * * * *